United States Patent [19]

Hudson et al.

[11] Patent Number: 4,636,438

[45] Date of Patent: Jan. 13, 1987

[54] MASKING FILMS

[75] Inventors: Andrew Hudson, Witney; Norman J. Stansfield, Deal, both of England

[73] Assignee: Autotype International Limited, Wantage, England

[21] Appl. No.: 741,645

[22] Filed: Jun. 5, 1985

[51] Int. Cl.⁴ .................. B32B 27/08; B32B 27/36
[52] U.S. Cl. .................. 428/412; 428/423.1; 428/423.7; 428/480; 428/483; 430/5
[58] Field of Search ............ 428/424.4, 474.4, 1, 428/483, 202; 430/5, 141; 427/272

[56] References Cited

U.S. PATENT DOCUMENTS

| | | | |
|---|---|---|---|
| 4,022,706 | 5/1977 | Davis | 428/1 X |
| 4,289,825 | 9/1981 | Kolycheck et al. | 428/424.4 |
| 4,337,296 | 6/1982 | Varadhachary | 428/424.4 |
| 4,347,300 | 8/1982 | Shimazu et al. | 430/141 X |
| 4,368,237 | 1/1983 | Yamada et al. | 428/474.4 X |

*Primary Examiner*—Thomas J. Herbert
*Attorney, Agent, or Firm*—Panitch, Schwarze, Jacobs & Nadel

[57] ABSTRACT

Masking films comprise a transparent base, preferably a polyester or a polycarbonate, directly carrying a masking film in the form of a dyed transparent plastics material based upon a vinyl chloride-vinyl acetate copolymer coating, which contains an aromatic polyester-based polyurethane. The amount of vinyl acetate and polyurethane in the coating preferably comprises 30% to 65% w/w of its total polymer content.

14 Claims, No Drawings

MASKING FILMS

DESCRIPTION

The invention relates to masking films of the type comprising a stable transparent base, carrying a dyed synthetic resin layer or coating, which may be cut and peeled from the base. The coated layer is heavily dyed, so that it has a high photographic density to actinic light, but also has good visual transparency. By cutting through the layer or coating and peeling parts away from the base, the film material can be used as a mask. For instance, photographic negatives can be inserted into the stripped areas. Alternatively, the coating may be imagewise cut and stripped away and can then form the original for further processing, for example, in the preparation of litho-plates or screen-printing stencil material. Masking films of this type are widely used for these and other applications in the printing industry.

Synthetic resins or polymers previously used in the preparation of such peelable coatings include heavily-plasticised nitrocellulose, polyurethane-cellulose acetate mixtures and polyvinylchloride. It is common practice to provide an intermediate layer or coating between the supporting film or other base and the peelable coating, such intermediate layer comprising an adhesive which is selected so as to give better adhesion properties to the coated layer and better stripping properties once the image has been cut. However, this type of product has several disadvantages:

(a) The edges of the mask, which remain after the image areas have been peeled away, tend to lift;

(b) If larger amounts of adhesive are applied in order to correct edge-lifting, the adhesive tends to "ooze" into the cut areas from under the remaining mask portions, especially in response to contact in a vacuum frame, in which it is common practice to use these materials; this adhesive then attracts dust and dirt and the mask becomes spoilt;

(c) The adhesive properties of the interlayer may change whilst the material is stored over a long period, due for instance to oxidation or to plasticiser migrating from the masking layer.

With the increased use of a computer-aided cutting devices these days, it has become necessary to devise materials which are without these disadvantages and enable very complex designs to be cut and stripped from the masking materials.

The present invention provides a light-screening masking film, comprising a supporting film or base directly carrying a masking layer which consists of a mixture of vinyl chloride-vinyl acetate copolymer, together with an aromatic polyester-based urethane.

The masking film of this invention has the advantage that the layer is coated directly on to the supporting film or base without an intermediate layer of adhesive. Because of the nature of the masking layer used in film products according to the invention, it has the following very desirable properties:

(1) Very high mechanical strength and elongation; this property enables larger areas or very fine detail to be removed without the membrane, ie. the masking layer, breaking during the removal;

(2) Excellent adhesion to the polyester base, without the need for an interlayer; this not only avoids the problem of edge-lifting, during the cutting and peeling operation, but also enables the requisite areas to be removed without breaking or tearing;

(3) Film modifiers such as dyes, matting or antistatic agents can be added in widely differing proportions, without having more than a marginal effect on the properties;

(4) The material shows no change in its stripping properties on ageing; this important property is in marked contrast to many of the films which contain an intermediate adhesive layer, which, on long-term storage, show considerable changes in the adhesive properties of the interlayer; such changes are presumably due to oxidation or to plasticiser migration from the masking layer;

(5) The layer is not sticky and has good cutting properties; many other polymer layers proposed for masking applications contain large amounts of plasticiser, in order to improve the cutting properties, and in consequence the membrane becomes sticky; one consequence of this is that these films cannot be rolled upon themselves and therefore expensive interleaving materials have to be employed, which are completely unnecessary with the masking films of this invention;

(6) The membrane has much reduced flammability in comparison with systems based on nitrocellulose.

In the masking film of this invention, the supporting film used is normally selected from polyethyleneterephthalate, polybutylene terephthalate, other polyester films or polycarbonate film. Drawn or undrawn film can be used.

The vinyl chloride-vinyl acetate copolymer forming the masking layer itself can contain any proportion of vinyl chloride to vinyl acetate. This polymer can be used in conjunction with any urethane derived from an aromatic diisocyanate by reaction with a diol-terminated polyester. It is surprising that polyurethanes of this type act as plasticisers for the vinyl chloride-vinyl acetate copolymers, because polyurethanes are generally hard materials with no obvious plasticising properties. If the vinyl acetate is considered as an "internal plasticiser" in the vinyl acetate-vinyl chloride copolymer, then the total plasticiser level, ie. vinyl acetate+polyurethane may not exceed 65% w/w of the total polymer content for a successful film to be cast, otherwise the film becomes too soft. On the other hand, if the total proportion of plasticiser, ie. vinyl acetate+polyurethane falls below 30% w/w the film becomes too brittle and adhesion is reduced to an unacceptable level. This is clearly shown in the examples given below.

In addition to the desirable properties mentioned above, the masking films of the invention have a number of practical advantages over the previously proposed systems. The materials are cheap, and readily available. The stripping layer is coated from common solvents. The coated layer releases solvents easily during the subsequent drying operation and thus facilitates this operation.

The coated layer contains dyes or pigments which have good solubility in the solvents employed, and good compatibility with the polymers. The coated layer may also contain matting agents, such as silica, and antistatic agents to reduce the problem of static attraction of dust and dirt to the film.

EXAMPLES

All coatings are 25μ thickness.

TABLE 1

| FORMULATION | GENERAL FORMULATIONS | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| VC/VAc Copolymer | 95 | 90 | 85 | 80 | 75 | 70 | 65 | 60 | 55 | 50 | 45 | 40 | 35 | 30 |
| Polyurethane | 5 | 10 | 15 | 20 | 25 | 30 | 35 | 40 | 45 | 50 | 55 | 60 | 65 | 70 |
| Silica | 3 | 3 | 3 | 3 | 3 | 3 | 3 | 3 | 3 | 3 | 3 | 3 | 3 | 3 |
| Dye Mixture | 7 | 7 | 7 | 7 | 7 | 7 | 7 | 7 | 7 | 7 | 7 | 7 | 7 | 7 |
| Antistat | 1 | 1 | 1 | 1 | 1 | 1 | 1 | 1 | 1 | 1 | 1 | 1 | 1 | 1 |
| Solvent blend | 360 | 360 | 360 | 360 | 360 | 360 | 360 | 360 | 360 | 360 | 360 | 360 | 360 | 360 |

Notes
(i) The VA/VC copolymer can have any ratio of VA to VC.
(ii) Polyurethane is one derived from an aromatic diisocyanate and a hydroxyl-terminated polyester.
(iii) The silica used throughout was OK 412[1].
(iv) The antistat used was Statexan[2] K1.
(v) The solvent blend is a 5:1 mixture of methylethyl ketone and the methyl ether of propandiol.

1. "OK 412" is a Registered Tradename of Degussa.
2. "Statexan K1" is a Registered Tradename of Bayer U.K.

Example 1

Using Lonza CL5440[3] as the P(VC/VAc) copolymer and using Estane[4] 5702.F3 as the polyurethane. For formulation details refer to Table 1.

| Formulation | 1 | 2 | 3 | 4 | 5 | 6 | 7 | 8 | 9 | 10 |
|---|---|---|---|---|---|---|---|---|---|---|
| Average Peel Strength (g/30 mm) | 80 | 140 | 140 | 170 | 140 | 140 | 150 | 200 | 280 | 320 |
| Tensile Strength (kg/cm²) | 440 | 420 | 420 | 350 | 380 | 300 | 320 | 290 | 280 | 200 |
| Elongation at Break % | 5 | 6 | 20 | 130 | 180 | 160 | 190 | 210 | 210 | 230 |
| "Plasticiser" as % of total polymer | 43 | 46 | 49 | 52 | 55 | 58 | 61 | 64 | 67 | 70 |

"Plasticiser" is % vinyl acetate and urethane against total polymer. 10 is over plasticised and stretches when peeled. 1, 2 and 3 are too brittle for practical use. The dye mixture used in Example 1 consists of two parts Lampronol[5] Light Orange R to one part of Lampronol[5] Light Yellow 2RN.

3. "CL 5440" is a Registered Tradename of Lonza.
4. "Estane" is a Registered Tradename of B. F. Goodrich.
5. "Lampronol" is a Registered Tradename of I.C.I.

Example 2

Using Vinnol[6] H40/60 as the P(VC/VAc) copolymer and using Europolymers 230[7] as the polyurethane.

| Formulation | 1 | 2 | 3 | 4 | 5 | 6 | 7 | 8 | 9 | 10 |
|---|---|---|---|---|---|---|---|---|---|---|
| Average Peel Strength (g/30 mm) | 40 | 60 | 100 | 100 | 130 | 140 | 300 | 370 | 470 | 480 |
| Tensile Strength (kg/cm²) | 480 | 460 | 460 | 420 | 450 | 330 | 300 | 250 | 250 | 130 |
| Elongation at Break (%) | 3 | 3 | 3 | 3 | 3 | 190 | 190 | 180 | 150 | 180 |
| "Plasticiser" as % age of total polymer | 43 | 46 | 49 | 52 | 55 | 58 | 61 | 64 | 67 | 70 |

9 and 10 are over plasticised and stretch when peeled. 1 to 5 are unacceptably brittle. The dye mixture used in Example 2 consists of two parts of Savinyl[8] Orange RLSE to one part of Savinyl[8] Yellow RLS.

6. "Vinnol" is a Registered Tradename of Wacker U. K.
7. "Europolymer 230" is a Registered Tradename of Europolymers.
8. "Savinyl" is a Registered Tradename of Sandoz.

Example 3

Using Vinnol[6] H15/50 as the P(VC/VAc) copolymer and Europolymers[7] 230 as the polyurethane.

| Formulation | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Average Peel Strength (g/30 mm) | — | TOO BRITTLE | — | TOO BRITTLE | — | TOO BRITTLE | 90 | 110 | 100 | 350 | 330 | 580 | — | 360 |
| Tensile Strength (kg/cm²) | — | | — | | — | | 320 | 270 | 300 | 280 | 260 | 190 | — | TOO STRETCHY |
| Elongation at Break (%) | — | — | — | — | — | — | 5 | 5 | 220 | 220 | 275 | >275 | — | |
| "Plasticiser" as % age of total polymer | 19¼ | 23½ | 27¾ | 32 | 36¼ | 40½ | 44¾ | 49 | 53¼ | 57½ | 61¾ | 66 | 70¼ | 74½ |

2, 4 and 6 were too brittle to test. 12 and 14 were over plasticised. Dye mixture as in Example 2.

Example 4

Using Vilit[9] AS47 as the P(VC/VAc) copolymer and Estane[7] 5702.F3 as the polyurethane.

| Formulation | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Average Peel Strength (g/30 mm) | — | — | — | 30 | 30 | 30 | 50 | 70 | 80 | 70 | 250 | 230 | TOO STRETCHY | TOO STRETCHY |
| Tensile Strength (kg/cm$^2$) | — | — | — | 320 | 290 | 300 | 280 | 290 | 290 | 310 | 250 | 220 | | |
| Elongation at Break (%) | — | — | — | 6 | 80 | 170 | 220 | 170 | 210 | 240 | 250 | >275 | | |
| "Plasticiser" as % age of total polymer | 19¼ | 23½ | 27¾ | 32 | 36¼ | 40½ | 44¾ | 49 | 53¼ | 57½ | 61¾ | 66 | 70¼ | 74½ |

13 and 14 were over plasticised. Dye Mixture as in Example 1.

10. "Vilit" is a Registered Tradename of Huls U. K.

We claim:

1. A masking film comprising a stable transparent base carrying a masking layer in the form of a dyed coating of a transparent plastics material wherein the masking layer comprises a vinyl chloride-vinyl acetate copolymer and an aromatic polyester-based polyurethane and is coated directly onto the transparent base, the masking layer adhering to but being peelable from the base.

2. A masking film according to claim 1, wherein the masking layer contains one or more matting agents and/or one or more antistatic agents.

3. A masking film according to claim 1, wherein the transparent base is selected from polyethylene terephthalate, polybutylene terephthalate or other polyesters and polycarbonate films.

4. A masking film according to claim 2, wherein the masking layer contains one or more matting agents and/or one or more antistatic agents.

5. A masking film according to claim 2, wherein the amount of vinyl acetate and polyurethane is in the range from 30% to 65% w/w of the total polymer content of the masking layer.

6. A masking film according to claim 5, wherein the masking layer contains one or more matting agents and/or one or more antistatic agents.

7. A masking film according to claim 2, wherein the polyurethane is made by the reaction of an aromatic diisocyanate with a diol-terminated polyester.

8. A masking film according to claim 7, wherein the masking layer contains one or more matting agents and/or one or more antistatic agents.

9. A masking film according to claim 1, wherein the amount of vinyl acetate and polyurethane is in the range from 30% to 65% w/w of the total polymer content of the masking layer.

10. A masking film according to claim 9, wherein the masking layer contains one or more matting agents and/or one or more antistatic agents.

11. A masking film according to claim 1, wherein the polyurethane is made by the reaction of an aromatic diisocyanate with a diol-terminated polyester.

12. A masking film according to claim 11, wherein the masking layer contains one or more matting agents and/or one or more antistatic agents.

13. A masking film according to claim 11, wherein the amount of vinyl acetate and polyurethane is in the range from 30% to 65% w/w of the total polymer content of the masking layer.

14. A masking film according to claim 13, wherein the masking layer contains one or more matting agents and/or one or more antistatic agents.

* * * * *